(12) United States Patent
Beghein

(10) Patent No.: US 7,899,147 B2
(45) Date of Patent: Mar. 1, 2011

(54) COUNTER/DIVIDER, AND PHASE LOCKED LOOP INCLUDING SUCH COUNTER/DIVIDER

(75) Inventor: Christophe C. Beghein, West Malling (GB)

(73) Assignee: MediaTek Singapore Pte. Ltd., Singapore (SG)

( * ) Notice: Subject to any disclaimer, the term of this patent is extended or adjusted under 35 U.S.C. 154(b) by 45 days.

(21) Appl. No.: 12/436,766

(22) Filed: May 6, 2009

(65) Prior Publication Data

US 2009/0296879 A1  Dec. 3, 2009

Related U.S. Application Data

(60) Provisional application No. 61/058,074, filed on Jun. 2, 2008.

(51) Int. Cl.
*H03K 21/00* (2006.01)
(52) U.S. Cl. .......................................... 377/47; 377/48
(58) Field of Classification Search .................. None
See application file for complete search history.

(56) References Cited

U.S. PATENT DOCUMENTS

| 4,184,068 | A | * | 1/1980 | Washburn | 377/44 |
| 4,633,194 | A | * | 12/1986 | Kikuchi et al. | 331/25 |
| 4,891,774 | A | * | 1/1990 | Bradley | 708/103 |
| 5,714,896 | A | * | 2/1998 | Nakagawa et al. | 327/115 |
| 5,878,101 | A | * | 3/1999 | Aisaka | 377/47 |
| 6,369,623 | B1 | * | 4/2002 | Heinen | 327/117 |
| 6,784,751 | B2 | * | 8/2004 | Salmi et al. | 331/16 |
| 6,952,121 | B1 | * | 10/2005 | Vu | 327/115 |

* cited by examiner

*Primary Examiner*—Tuan Lam
(74) *Attorney, Agent, or Firm*—Winston Hsu; Scott Margo

(57) ABSTRACT

A counter/divider where the counter/divider comprises a: a pre-scaler operable in a first mode to divide an input signal by M and in a second mode to divide the input signal by N, where N is greater than M; a first programmable counter, and a second programmable counter; and where the first and second programmable counters are responsive to an output of the pre-scaler and an output of the first counter controls whether the pre-scaler operates in the first mode or the second mode, wherein the first counter is operable to count to greater than one.

14 Claims, 2 Drawing Sheets

| Divide ratio | This Invention B | This Invention A | result | lookup table # | Prior art B | Prior art A |
|---|---|---|---|---|---|---|
| 26 | 9 | 1 | 26 | 1 | 13 | 0 |
| 27 | 9 | 0 | 27 | 2 | 13 | 1 |
| 28 | 10 | 2 | 28 | 3 | 14 | 0 |
| 29 | 10 | 1 | 29 | 4 | 14 | 1 |
| 30 | 10 | 0 | 30 | 5 | 15 | 0 |
| 31 | 11 | 2 | 31 | 6 | 15 | 1 |
| 32 | 11 | 1 | 32 | 7 | 16 | 0 |
| 33 | 11 | 0 | 33 | 8 | 16 | 1 |
| 34 | 12 | 2 | 34 | 9 | 17 | 0 |
| 35 | 12 | 1 | 35 | 10 | 17 | 1 |
| 36 | 12 | 0 | 36 | 11 | 18 | 0 |
| 37 | 13 | 2 | 37 | 12 | 18 | 1 |
| 38 | 13 | 1 | 38 | 13 | 19 | 0 |
| 39 | 13 | 0 | 39 | 14 | 19 | 1 |
| 40 | 14 | 2 | 40 | 15 | 20 | 0 |
| 41 | 14 | 1 | 41 | 16 | 20 | 1 |
| 42 | 14 | 0 | 42 | 17 | 21 | 0 |
| 43 | 15 | 2 | 43 | 18 | 21 | 1 |
| 44 | 15 | 1 | 44 | 19 | 22 | 0 |
| 45 | 15 | 0 | 45 | 20 | 22 | 1 |
| 46 | 16 | 2 | 46 | 21 | 23 | 0 |
| 47 | 16 | 1 | 47 | 22 | 23 | 1 |
| 48 | 16 | 0 | 48 | 23 | 24 | 0 |

FIG. 2

COUNTER/DIVIDER, AND PHASE LOCKED LOOP INCLUDING SUCH COUNTER/DIVIDER

FIELD OF THE INVENTION

The present invention relates to a counter/divider, and to a phase locked loop including such a counter/divider. A phase locked loop of this type is often used within a frequency synthesiser.

BACKGROUND OF THE INVENTION

Frequency synthesisers can be used to derive a stable high frequency signal from a lower frequency clock. An example of a known frequency synthesiser topology is schematically illustrated in FIG. 1.

The frequency synthesiser 1 comprises a master oscillator 2, which is typically a crystal oscillator, which defines a well controlled clock signal. An output of the oscillator 2 is provided either directly, or indirectly, to a first input 4 of a phase comparator 6. An output 8 of the phase comparator 6 is provided to an input of a voltage controlled oscillator 12 via a filter 10. The filter 10 is included so as to filter out unwanted noise.

An output of the voltage controlled oscillator is provided to an input of a dual modulus pre-scaler 20. The pre-scaler 20 is responsive to a pre-scaler control signal to divide by input signal by M or by N, which is typically M+1.

An output of the pre-scaler is provided to first and second counters 22 and 24, respectively. The person skilled in the art may know the counters as "A" and "B" counters.

The "A" counter 22 determines the number of voltage controlled oscillator cycles that the pre-scaler will divide by M+1. The action of dividing by M+1 is often known to the person skilled in the art as "swallowing cycles" as it is equivalent to dividing by M and "swallowing" (discarding) one cycle. The B counter merely counts the number of cycles output by the pre-scaler.

This arrangement allows the effective divide ratio of the divider formed by the pre-scaler and the first and second counters to assume any integer number.

SUMMARY OF THE INVENTION

According to a first aspect of the present invention there is provided a counter/divider where the counter/divider comprises:
a pre-scaler operable in a first mode to divide an input signal by M and in a second mode to divide the input signal by N, where N is greater than M;
a first programmable counter, and
a second programmable counter; and
where the first and second programmable counters are responsive to an output of the pre-scaler and an output of the first counter controls whether the pre-scaler operates in the first mode or the second mode, wherein the first counter is operable to count to greater than one, and in use, the values loaded into the first and second counters are selected to cause the pre-scaler to operate in the second mode for the majority of the time.

It is thus possible to reduce power consumption by reducing the frequency supplied to the counters. This becomes increasingly important where the pre-scaler is operable to divide by only relatively small numbers, such as two and three.

According to a second aspect of the present invention there is provided a method of operating a counter/divider where the counter/divider comprises:
a pre-scaler operable in a first mode to divide an input signal by M and in a second mode to divide the input signal by N, where N is an integer greater than M;
a first programmable counter; and
a second programmable counter;
where the first and second programmable counters are responsive to an output of the pre-scaler and an output of the first counter controls whether the pre-scaler counts in the first mode or the second mode, the method comprising loading the first counter with a value that causes the pre-scaler to count in the second mode for the majority of the time that it is in use.

BRIEF DESCRIPTION OF THE DRAWINGS

The present invention will now be described, by way of example only, with reference to the accompanying drawings, in which:

FIG. 2 is a table comparing counter values in an embodiment of the invention with those of prior art counters.

DESCRIPTION OF PREFERRED EMBODIMENTS OF THE INVENTION

Figure 1:
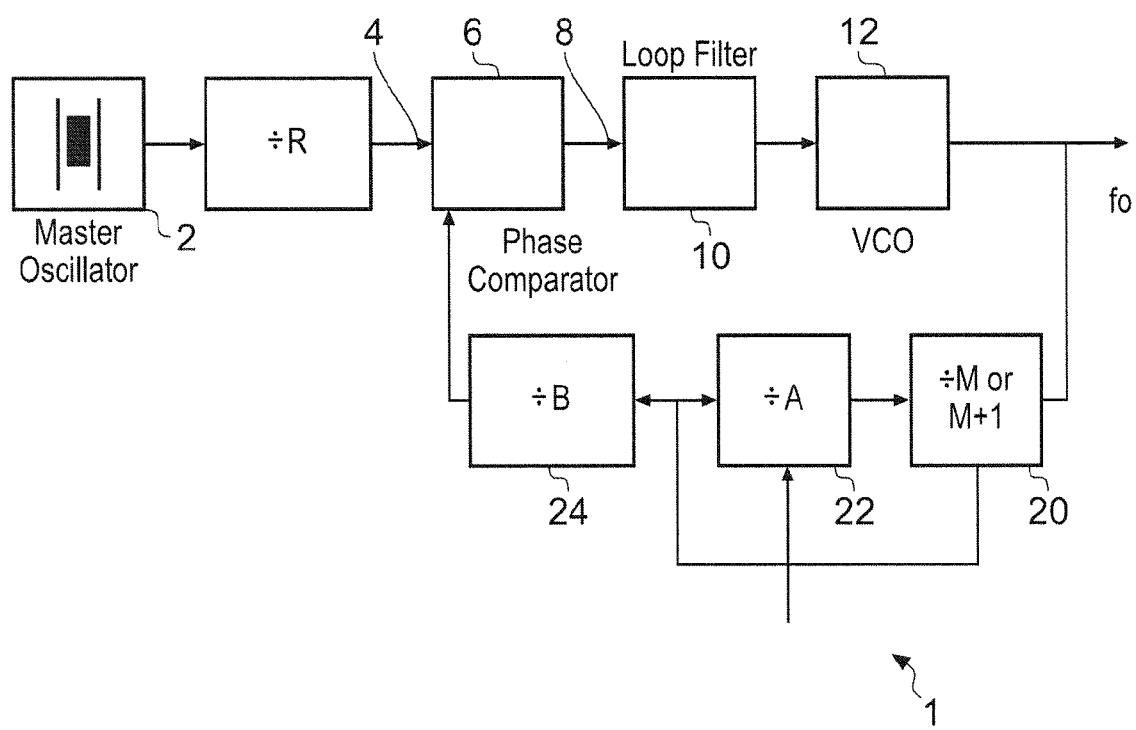
FIG. 1 schematically illustrates a phase locked loop including a counter constituting an embodiment of the invention when the "A" counter can count to a number greater than 1.

If we consider the counter/divider in the phase locked loop of FIG. 1 in greater detail we can see that in the prior art mode of operation it can divide by any integer X as long as the values of A and B counted by the first and second counters are chosen correctly.

If the pre-scaler is operable to divide by 2 or 3, so M=2, then any divide ratio X can be achieved by setting $$B = \text{abs}\left(\frac{X}{2}\right)$$
$$A = X - 2B$$

Thus if we wished to divide by 7

$$B = \text{abs}\left(\frac{7}{2}\right) = 3$$
$$A = 7 - (2 \times 3) = 1$$

For the first three VCO cycles the pre-scaler divides by 3 so after the third cycle it outputs a pulse. The A counter counts the first pulse and switches the pre-scaler to divide 2. B is also incremented. After another 2 cycles of the VCO the pre-scaler outputs another pulse so B increments to 2. So far we have counted 5 VCO cycles. After a further 2 VCO cycles, so seven in all, the pre-scaler outputs a further pulse, thereby incrementing B to 3, which corresponds to its pre-set number. The second counter outputs a pulse or changes the sign of its output, and the counters are reloaded with their initial values so that the process is restarted.

If we chose to divide by 40, then according to the formula $$B = \text{abs}\left(\frac{40}{2}\right) = 20$$
$$A = 40 - (2 \times 20) = 0$$

Thus A is set to zero, and the pre-scaler always operates in the divide by 2 mode.

Typically the second counter 24, (the B counter) is a relatively large counter, 5 bits in this case, whereas the A counter is a single bit counter (A=1 or 0).

The inventor noted that the prior art maximises the time for which the pre-scaler is in the lowest division mode. Consequently the signals supplied to the first and second counters are needlessly fast for most of the time.

The inventor realised that the clock speed at the output of the pre-scaler could be reduced by letting the value of A take a value greater than 1. In such a revised scheme B must still be greater than or equal to A when, as shown in FIG. 1, both the first and second counters count in parallel.

If we now seek to divide by 40 we see by inspection that the following condition must be satisfied $$40 = X = 3A + 2(B-A)$$

and we should seek to maximise the value of A.

The highest value of A which also allows B to take an integer value is

A=12, B=14

Thus for the first 3A=36 cycles the pre-scaler divides by 3 such that after 36 cycles A changes state and B=12. The pre-scaler then switches to divide by 2 mode such that B=14 after a further 4 cycles, having counted 40 cycles in all. The counters are then reset to their initial values so as to count the next 40 cycles.

Both the first and second counters are now 4 bits wide in this example.

However, if we compare the frequency at the output of the pre-scaler then it is noted that the output frequency is modified.

Suppose that the VCO nominally runs at 4.28 GHz. Suppose also that a fixed divide by 2 counter is interposed between the VCO output and the pre-scaler. Then, if the loop is controlled to divide by 80 (2×40) then:

In the prior art the frequency at the output of the pre-scaler is $$\frac{4.28 \text{ GHz}}{4} = 1.07 \text{ GHz } 100\%$$

of the time.

In a system working in accordance with the present invention the frequency at the output of the pre-scaler is $$\frac{4.28 \text{ GHz}}{6} = 713 \text{ MHz}$$

for 86% of the time and 1.07 GHz for 14% of the time.

Thus power losses associated with charging and discharging of gate and parasitic capacitances within a CMOS circuit implementing the first and second counters is significantly reduced.

Further power savings could be made if either the A or B counters were shorter.

In a further embodiment of the invention the length of the A counter can be reduced by causing it to count the number of cycles that the pre-scaler should be in the divide by 2 mode rather than the number of cycles that the pre-scaler should be in the divide by 3 mode. This is contrary to the accepted wisdom, but as we will see it brings significant benefits.

If A only counts the number of cycles that the counter is to operate in divide by 2 mode then A only need to be a two bit counter as it only needs to be able to count to two in this example.

FIG. 2 is a table showing the values loaded into the first and second counters in a second embodiment of the invention for divide ratios in the range 26 to 48. In an embodiment of the invention the divider is expected to operate in the divide range of 32 to 42. For comparison the table also shows the values loaded into a divider operating in accordance with the prior art. The required divide ratio 26 to 48 can be used to access a look-up table, shown here as ranges 1 to 23, to find the values of A and B to be loaded into the counters.

It can be seen that in the divide range 32 to 42 the B counter takes a value between 11 and 14, and hence can be expressed as a 4 bit number. The A counter takes the value 0, 1 or 2 and hence is a two bit counter.

The prior art B counter takes values in the range 16 to 21 and hence is a five bit counter, whereas the A counter only takes the values 0 or 1, and hence is a single bit counter.

Thus, the present invention allows the divide ratio to be expressed in the same number of bits as the prior art, but runs the counters at a lower speed most of the time by circuit of maximising the time that the pre-scaler is operating at its highest divide ratio or "swallowing" mode. Thus a power saving can be achieved, especially if the pre-scaler is chosen to use less power when in the divide by N, e.g. divide by 3, mode.

The invention claimed is:

1. A counter/divider where the counter/divider comprises:
   a pre-scaler operable in a first mode to divide an input signal by M and in a second mode to divide the input signal by N, where N is greater than M;
   a first programmable counter, and
   a second programmable counter; and
   where the first and second programmable counters are responsive to an output of the pre-scaler and an output of the first counter controls whether the pre-scaler operates in the first mode or the second mode, wherein the first counter is operable to count to greater than one, and in use, the values loaded into the first and second counters are selected to cause the pre-scaler to operate in the second mode for the majority of the time.

2. A counter/divider as claimed in claim 1, in which the first counter counts the number of times that the pre-scaler is to operate in the second mode.

3. A counter/divider as claimed in claim 1, in which the first counter counts the number of times that the pre-scaler is to operate in the first mode.

4. A counter/divider as claimed in claim 3, in which the first counter is operable to count to 0, 1 or 2.

5. A counter/divider as claimed in claim 4, in which the maximum value that the first counter can count to is equal to or less than 3.

6. A counter/divider as claimed in claim 1, in which the pre-scaler uses less power when dividing by N.

7. A counter/divider as claimed in claim 2, in which the first and second counters can count up to 15.

8. A counter/divider as claimed in claim 1, in which M=2, and N=3.

9. A phase locked loop including a counter/divider as claimed in claim 1.

10. A mobile communications device including a frequency synthesiser having a phase locked loop as claimed in claim 9.

11. A method of operating a counter/divider where the counter/divider comprises:

a pre-scaler operable in a first mode to divide an input signal by M and in a second mode to divide the input signal by N, where N is an integer greater than M;

a first programmable counter; and a second programmable counter;

where the first and second programmable counters are responsive to an output of the pre-scaler and an output of the first counter controls whether the pre-scaler counts in the first mode or the second mode, the method comprising loading the first counter with a value that causes the pre-scaler to count in the second mode for the majority of the time that it is in use.

12. A method as claimed in claim 11, in which the first programmable counter can count a value greater than one.

13. A method as claimed in claim 11, in which the first programmable counter counts the number of times that the pre-scaler is to operate in the first mode, and then switches the pre-scaler to operate in the second mode.

14. A method as claimed in claim 11, in which the time that the pre-scaler counts in the second mode is maximised.

* * * * *